(12) United States Patent
Abe et al.

(10) Patent No.: US 7,239,556 B2
(45) Date of Patent: Jul. 3, 2007

(54) NAND-STRUCTURED FLASH MEMORY

(75) Inventors: Takumi Abe, Yokohama (JP); Hiroshi Maejima, Chigasaki (JP); Koichi Fukuda, Yokohama (JP); Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 11/057,203

(22) Filed: Feb. 15, 2005

(65) Prior Publication Data

US 2005/0180213 A1 Aug. 18, 2005

(30) Foreign Application Priority Data

Feb. 17, 2004 (JP) ............................... 2004-040132

(51) Int. Cl.
*G11C 11/34* (2006.01)

(52) U.S. Cl. ............. 365/185.33; 365/200; 365/185.17

(58) Field of Classification Search ........... 365/185.33, 365/200, 185.17, 185.2, 185.02
See application file for complete search history.

(56) References Cited

U.S. PATENT DOCUMENTS

| | | | |
|---|---|---|---|
| 6,046,935 A | 4/2000 | Takeuchi et al. | |
| 6,061,270 A * | 5/2000 | Choi | 365/185.02 |
| 7,079,437 B2 | 7/2006 | Hazama et al. | |
| 2005/0056869 A1* | 3/2005 | Ichige et al. | 257/222 |
| 2005/0174852 A1* | 8/2005 | Hemink | 365/185.28 |

FOREIGN PATENT DOCUMENTS

| | | |
|---|---|---|
| JP | 10-199280 | 7/1998 |
| JP | 2002-237194 | 8/2002 |

\* cited by examiner

*Primary Examiner*—Richard T. Elms
*Assistant Examiner*—Dang Nguyen
(74) *Attorney, Agent, or Firm*—Oblon, Spivak, McClelland, Maier & Neustadt, P.C.

(57) ABSTRACT

A NAND-structured flash memory comprises a memory cell array wherein plural memory strings are arranged in matrix form, each of the memory cell strings including plural nonvolatile memory cells, the first conducting paths of the memory cells being connected in series, at least one of the memory cells having a function other than an external data storing function, plural first selection transistors having second conducting paths, and one end of the second conducting paths being connected to one end of the series of the first conducting paths, respectively, plural bit lines connected to the other end of the second conducting paths, plural second selection transistors having third conducting paths, and one end of the third conducting paths being connected to one end of the series of the first conducting paths, respectively, and a source line connected to the other end of the third conducting paths.

11 Claims, 11 Drawing Sheets

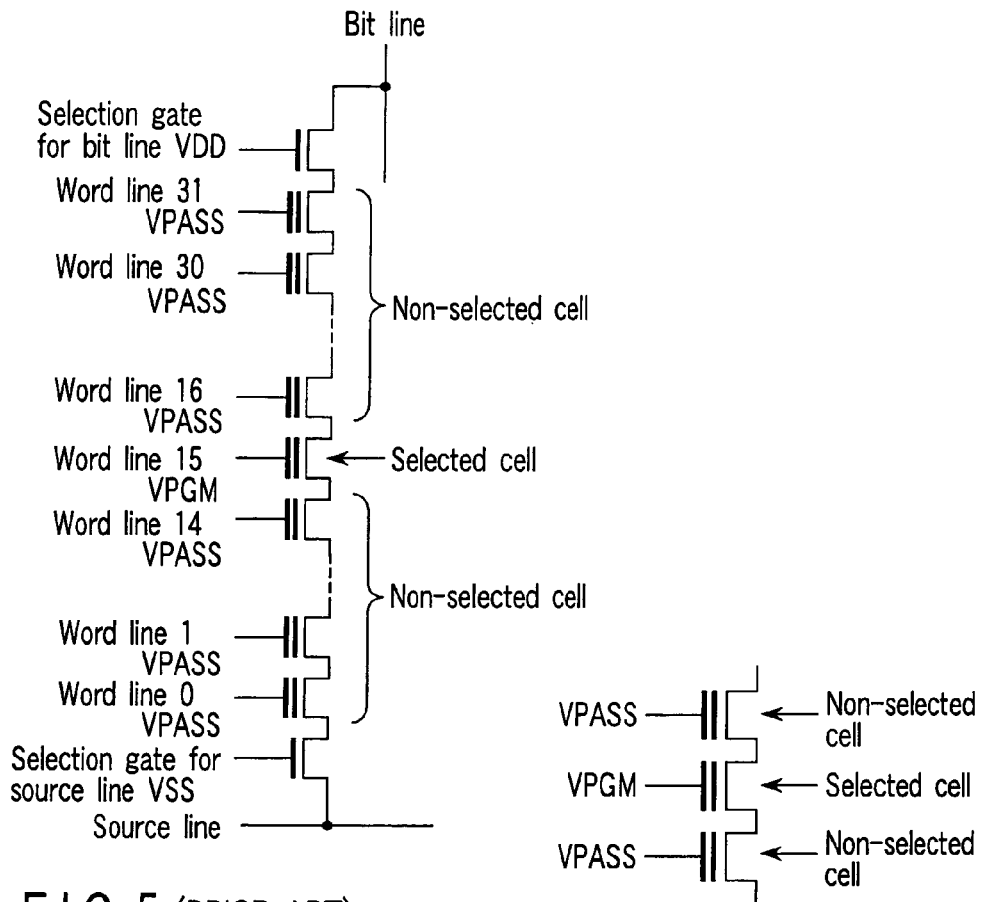
FIG. 5 (PRIOR ART)
FIG. 6 (PRIOR ART)
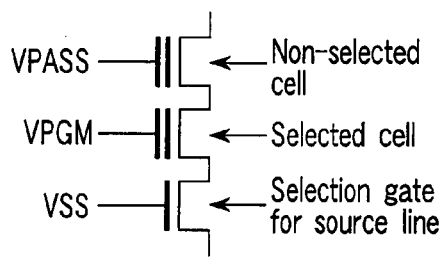
FIG. 7A
(PRIOR ART)
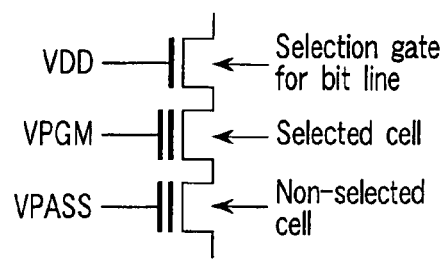
FIG. 7B
(PRIOR ART)

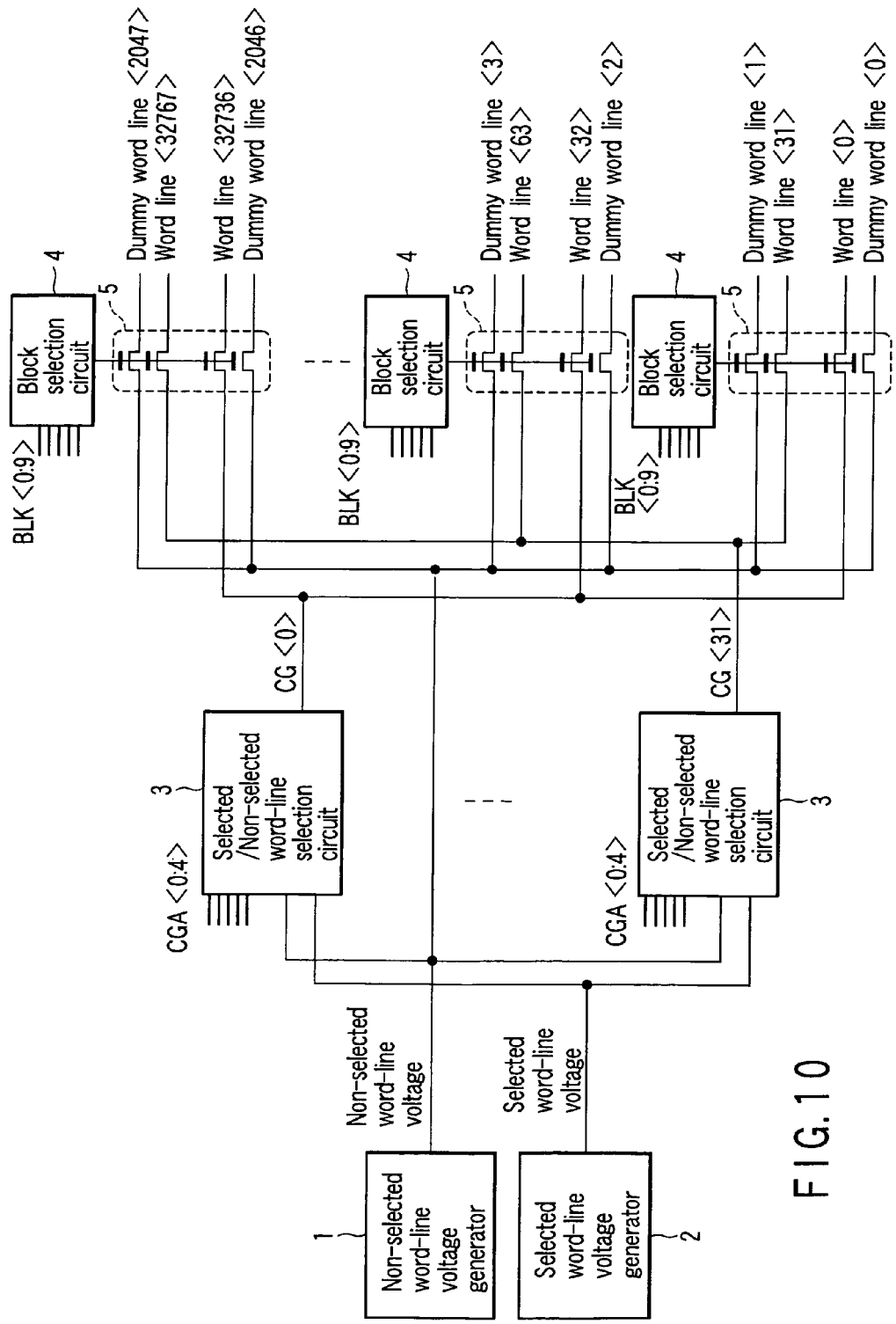
F I G. 10

NAND-STRUCTURED FLASH MEMORY

CROSS-REFERENCE TO RELATED APPLICATIONS

This application is based upon and claims the benefit of priority from prior Japanese Patent Application No. 2004-040132, filed Feb. 17, 2004, the entire contents of which are incorporated herein by reference.

BACKGROUND OF THE INVENTION

1. Field of the Invention

The present invention relates to a nonvolatile semiconductor memory device, especially a NAND-structured flash memory, and in particular relates to a configuration of a core portion of the memory and its control circuit.

2. Description of the Related Art

Recently, an EEPROM (NAND-structured flash memory) having NAND-structured cells has often been used as an EEPROM having a larger capacity in digital devices such as digital cameras and mobile telephones.

Various improvements have been attempted in the NAND-structured flash memory with increasing use thereof. For example, in Jpn. Pat. Appln. KOKAI Publication No. 10-199280, driving is performed with a pair of adjacent bit lines in such a manner that when one of them is in a selected state, the other is in a non-selected state, in order to prevent erroneous operations due to noise or word line delay. In this case, the non-selected bit line is used as a dummy bit line, and data is sensed from the pair of bit lines by a differential amplifier. A dummy cell having a larger on-resistance than a memory cell is connected between the bit line and a source line, and in such a configuration, the dummy cell connected to the non-selected bit line is turned on. Further, the memory cell and the dummy cell are designed such that the dummy bit line indicates a midpoint potential in association with a voltage change of the selected bit line when data "0" and "1" are read.

Furthermore, Jpn. Pat. Appln. KOKAI Publication No. 2002-237194 provides a pre-charging method in which, in order to reduce time to pre-charge the bit lines, two pre-charge sections are provided, and one pre-charge section supplies a data line with a current that can be varied in accordance with voltage changes of the data line, while the other pre-charge section supplies the data line with a constant current irrespective of the voltage changes of the data line.

Incidentally, in a write operation of the NAND-structured flash memory, when the memory cell in the center of a NAND string is the selected cell, the memory cells on both sides thereof are also ordinary memory cells, so that a bias state of several cells around the selected cell is symmetrical. Conversely, when the memory cell at the end of the NAND string is the selected cell, the bias state around the selected cell is asymmetrical because one cell serves as a selection gate. As a result, the characteristics of writing into the memory cell are different in the memory cell next to the selection gate and the other memory cells.

In binary operation with little concern about increasing threshold distribution, the difference in characteristics is not a large problem. However, in the case of multi-level operation such as quaternary, octal and hexadecimal levels, the width of threshold distribution needs to be controlled to narrow the width, and it is therefore desired to have a uniform characteristic of memory cell writing.

If the writing characteristics are different in the memory cell at the end of the NAND string such as the memory cell next to the selection gate, and the memory cell in the center of the NAND string, it is necessary to individually control the voltage applied to a control gate of the memory cell, for example, depending on where the selected cell is located, and thus a complicated control circuit is needed to achieve this.

In addition, for example, step-up writing is utilized at present in which the writing voltage is stepped up to further reduce the width of threshold distribution. However, if the writing characteristics are significantly different in the memory cells, more time is spent in the step-up writing to reduce the width of threshold distribution, leading to lower performance.

Moreover, in writing, if the state of the selected cell should remain unchanged (electric charges should not be injected into a floating gate), a channel of the NAND string is previously charged before a word line is charged to a predetermined voltage.

At this moment, the gate potential of the source line side selection gate is VSS, and the selection gate is in a cut-off state. However, if a predetermined voltage is applied to the memory cell adjacent to the selection gate, the coupling capacitance of the selection gate and the control gate of the memory cell adjacent thereto causes the gate potential of the selection gate to float from VSS. This causes a phenomenon in which the selection gate conducts and the electric charges in the channel are discharged. In this way, "erroneous writing" occurs where a charge is injected into the floating gate of the selected cell whose state should not be changed.

On the other hand, in the NAND-structured flash memory, the size of one cell array tends to be increased directly with increasing capacity, and the length of the word line and bit line is only increasing. This is because array division is avoided as much as possible to reduce chip size to the minimum for cost reduction.

Furthermore, parasitic capacitance and resistance increase along with the increase in the length of the word line and bit line, which is a disadvantage to the performance of a chip, and therefore, some measures need to be taken. For example, the increased bit line length poses such problems that the pre-charge time is increased, that time is increased for a cell current to cause a small potential difference in the bit line, and that time is increased for the bit lines to recover their original state.

Moreover, the following problems are posed in a reading operation of the NAND-structured flash memory. In reading, the selected bit line is pre-charged to a predetermined voltage, and the potential of the non-selected bit line will be VSS which is a bit line shield potential. After the selected bit line has been pre-charged, a bit line side selection gate is opened to discharge the electric charges from the cell to the bit line in accordance with a threshold value (signal) written into the cell connected to the selected word line, and its small potential difference is amplified by a sense amplifier. After it is sensed, the bit line recovers its original potential.

On the other hand, the bit lines on both sides of the selected bit line are non-selected bit lines. Noise due to coupling is reduced in such a manner that the non-selected bit lines have a fixed potential (e.g., VSS) and are used as shielding lines. More specifically, the selected bit line and the non-selected bit lines are alternately arranged, and they are allocated in different pages. They are temporarily differentiated by parity, and respectively called an EVEN page and an ODD page.

In order to decrease the bit line pre-charge time, the non-selected bit line which is currently at VSS may be pre-charged to a pre-charge potential at the same time. The pre-charge time is reduced because the wiring capacitance between effective adjacent lines is eliminated and the wiring capacitance necessary to drive all the bit lines is reduced.

In this case, however, in the conventional structure of the NAND string, when the cell linked to the non-selected bit line serving as a shield has a negative threshold value ("1"), opening the selection gate will cause the current to flow from its bit line to the source line to lower the potential, resulting in a problem that it cannot serve as the shielding line.

Therefore, it has been desired to realize a NAND-structured flash memory capable of accomplishing a uniform writing characteristic of the memory cells by equalizing the writing characteristic of the memory cell at the end of the NAND string with that of the memory cell in the center.

Furthermore, there has also been a desire for a NAND-structured flash memory capable of reducing the pre-charge time in a bit line pre-charge operation when reading or verifying the NAND-structured flash memory.

BRIEF SUMMARY OF THE INVENTION

According to a first aspect of the invention, there is provided a NAND-structured flash memory, which comprises:

a memory cell array in which a plurality of memory strings are arranged in matrix form, each of the memory cell strings including a plurality of nonvolatile memory cells, the plurality of memory cells having first conducting paths and control gates, respectively, the first conducting paths of the plurality of memory cells being connected in series, at least one of the nonvolatile memory cells constituting each of the plurality of the memory strings having a function other than an external data storing function;

a plurality of first selection transistors having second conducting paths, and one end of the second conducting paths being connected to one end of the series of the first conducting paths, respectively;

a plurality of bit lines connected to the other end of the second conducting paths of the plurality of first selection transistors, respectively;

a plurality of second selection transistors having third conducting paths, and one end of the third conducting paths being connected to one end of the series of the first conducting paths, respectively; and a source line connected to the other end of the third conducting paths of the plurality of second selection transistors.

According to a second aspect of the invention, there is provided a NAND-structured flash memory, which comprises:

a selection transistor having a first conducting path, one end of the first conducting path being connected to a bit line or a source line;

at least one dummy gate having a second conducting path and a control gate, one end of the second conducting path being connected to the other end of the first conducting path of the selection transistor;

a nonvolatile memory linked unit for storing external data, which includes a plurality of electrically erasable/writable nonvolatile memory cells having third conducting paths and control gates, the third conducting paths being connected in series, one end of the series of the third conducting paths being connected to the other end of the second conducting path of the dummy gate;

a dummy gate driving circuit controlling a potential of the control gate of the dummy gate; and a memory cell driving circuit selectively driving the control gates of the plurality of nonvolatile memory cells to write, read or erase bit data for storing the external data.

According to a third aspect of the invention, there is provided a NAND-structured flash memory comprising:

a memory cell array in which a plurality of memory strings having a plurality of serially connected memory cells are arranged in matrix form;

first selection transistors having first conducting paths, one end of the first conducting paths being connected to an end of the plurality of memory strings, respectively;

second selection transistors having second conduction paths, one end of the second conducting paths being connected to the other end of the plurality of memory strings; and a plurality of bit lines connected to the other end of the first conducting paths of the first selection transistors, wherein in at least one memory cell in each of the memory strings, information on whether one of the bit lines linked to the at least one memory cell is an even number column or an odd number column is written.

BRIEF DESCRIPTION OF THE SEVERAL VIEWS OF THE DRAWING

FIG. 5 is a diagram to explain a method of reading from a NAND-structured flash memory;

FIG. 6 is a diagram showing the state of cells adjacent to a selected cell in the center of the NAND string;

FIG. 7A is a diagram showing the state of cells adjacent to the selected cell at the end of the NAND string on a source line side;

FIG. 7B is a diagram showing the state of cells adjacent to the selected cell at the end of the NAND string on a bit line side;

FIG. 10 is a circuit diagram of a word line voltage control circuit in the first embodiment;

DETAILED DESCRIPTION OF THE INVENTION

Figure 1:
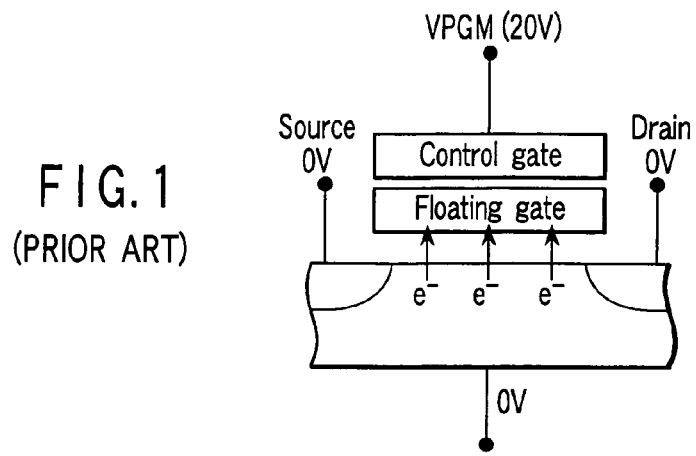
FIG. 1 is a diagram to explain a write operation of a nonvolatile memory.

Embodiments of the present invention will hereinafter be described referring to the drawings.

First Embodiment

Before describing the embodiments, a bias condition in writing into a NAND-structured flash memory is shown in FIG. 1 to reconfirm characteristics of the NAND-structured flash memory. In this method, a channel is fixed at ground potential, and a high potential (hereinafter referred to as VPGM) is applied to a control gate which is a word line, so as to pull electrons from the entire channel, and store the electrons in a floating gate. A threshold value of a memory cell transistor changes in accordance with the amount of electric charge stored in the floating gate.

Figure 2:
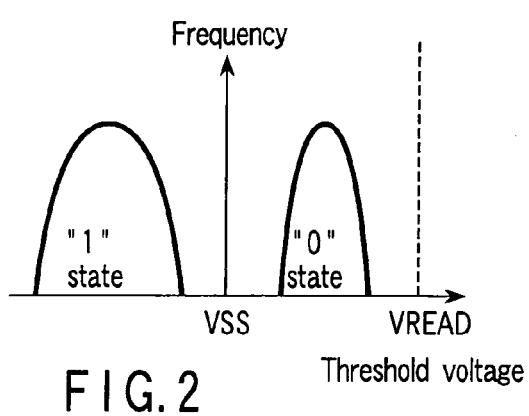
FIG. 2 is a graph showing threshold distribution of a binary memory cell.
Figure 3:
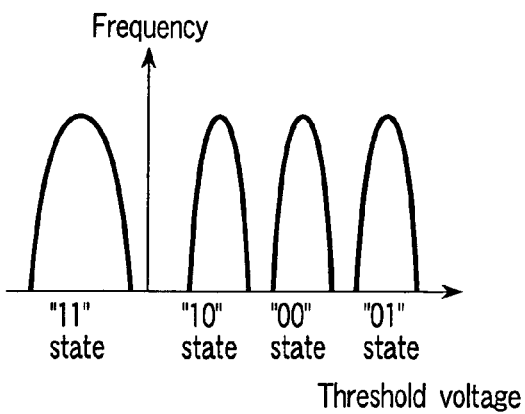
FIG. 3 is a graph showing threshold distribution of a quaternary memory cell.

As shown in FIG. 2, in a NAND structure using a binary cell, a state in which electrons are stored in the floating gate and a state in which electrons are not stored are identified to store one bit. Further, as shown in FIG. 3, in a NAND structure using a multi-level cell, the threshold value of the memory transistor which changes in accordance with the amount of electric charge stored in the floating gate is identified as several states. The amount of electric charge stored in the floating gate is controlled in accordance with, for example, a voltage applied to the control gate and time of applying the voltage in writing.

Figure 4:
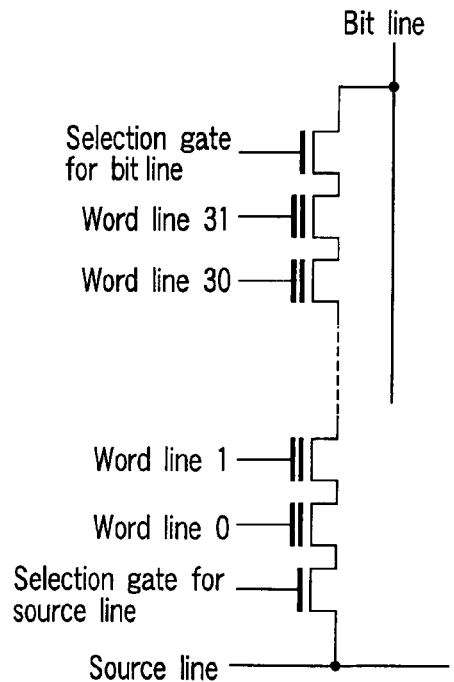
FIG. 4 is a circuit diagram showing a structure of conventional one NAND string.
Figure 8:
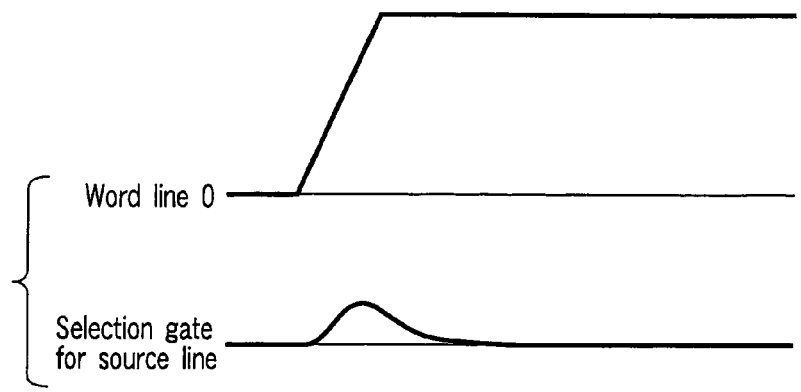
FIG. 8 is a diagram to explain a problem caused in a selection gate at the end shown in FIG. 7A.

FIG. 4 shows a structure of a NAND string, which is a base unit of the NAND-structured flash memory. The NAND string has one end connected to a bit line and the other end connected to a source line. Further, both ends of the NAND string comprise selection gates (selection transistors) for selecting the NAND string. In a write operation, only one of a plurality of memory cells constituting the NAND string (memory cell linked unit) will be a memory cell targeted for writing, and the VPGM is applied to the control gate of this memory cell. This memory cell will hereinafter be called a selected cell.

On the other hand, a voltage to prevent erroneous writing (hereinafter referred to as VPASS) is applied to the control gates of the memory cells other than the selected cell (hereinafter referred to as non-selected cells), as shown in FIG. 5.

When the memory cell in the center of the NAND string is the selected cell, the memory cells on both sides thereof are also ordinary memory cells, resulting in a symmetrical bias relationship as shown in FIG. 6. Conversely, when the cell at the end of the NAND string is the selected cell, a bias is given in a special manner as shown in FIGS. 7A and 7B because one cell serves as the selection gate. As a result, the characteristics of writing into the memory cell are different in the memory cells next to the selection gate and the other memory cells.

In binary operation with little concern about increasing threshold distribution, this difference in characteristics is not a large problem. However, in the case of multi-level operation such as quaternary, octal and hexadecimal levels, the width of threshold distribution needs to be controlled to narrow the width, and it is therefore desired to have a uniform characteristic of memory cell writing.

Moreover, in writing, if the state of the selected cell should remain unchanged (electric charges should not be injected into the floating gate), the channel of the NAND string is previously charged before the word line is charged to VPGM or VPASS.

At this moment, the gate potential of the source line side selection gate is VSS, and the selection gate is in a cut-off state. However, if the VPGM or VPASS is applied to the memory cell adjacent to the selection gate, the coupling capacitance of the selection gate and the control gate of the memory cell adjacent thereto causes the gate potential of the selection gate to float from VSS. This causes a phenomenon in which the selection gate conducts and the electric charges in the channel are discharged. In this way, the "erroneous writing" occurs where a charge is injected into the floating gate of the selected cell whose state should not be changed.

Figure 9:
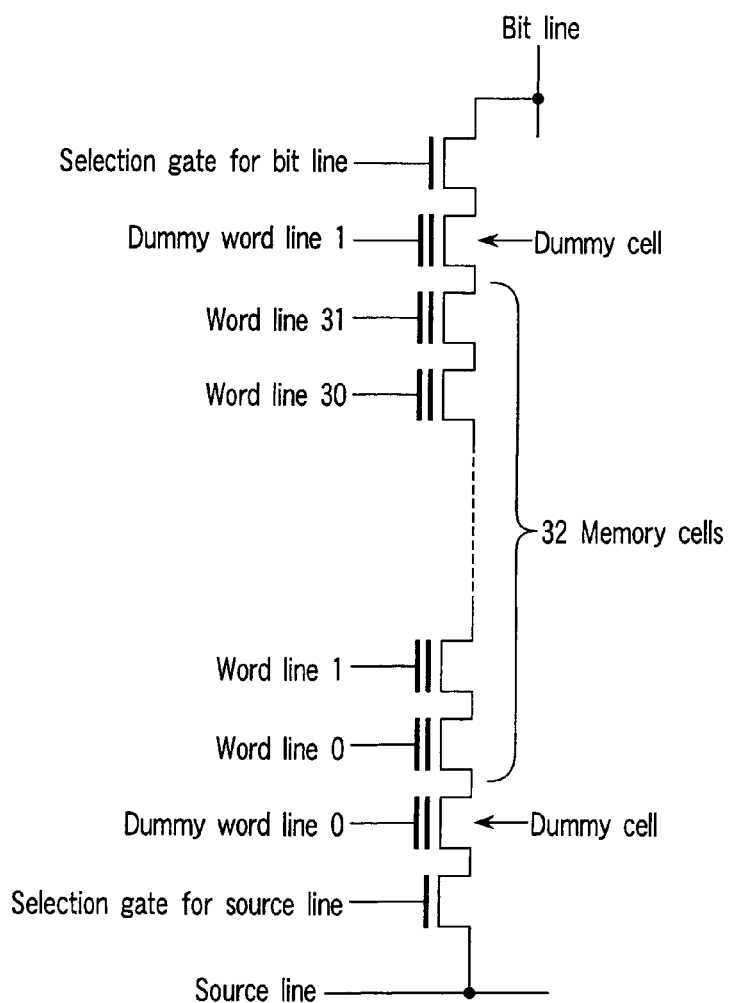
FIG. 9 is a circuit diagram showing the structure of one NAND string in a first embodiment of the present invention.

Next, the NAND-structured flash memory according to a first embodiment of the present invention that can solve the problem described above will be described. The NAND-structured flash memory of the first embodiment is a quaternary NAND-structured flash memory, and as shown in FIG. 9, one NAND string is composed of a bit line side selection gate (selection transistor), 34 memory cells, and a source line side selection gate, wherein the memory cell next to the bit line side selection gate and the memory cell next to the source line side selection gate are treated as dummy cells (dummy gates). The 32 memory cells between the two dummy cells are treated as quaternary cells.

As information is not stored in the dummy cells (dummy gates), the dummy cells are always treated as the non-selected cells in writing and reading. Insertion of the dummy cells will provide a structure in which the memory cell at the end is also placed between the cells on both sides, so that the writing operation can be performed on the uniform bias condition in the 32 memory cells placed between the dummy cells.

In FIG. 10, only one block composed of 32 word lines and two dummy word lines is selected by a block selection circuit 4 in accordance with a block selection address BLK<0:9>. A high voltage (e.g., 27 V) is applied to a gate of a transfer gate 5 which is linked to the word line of the selected block, and 0 V is applied by the block selection circuit 4 to a gate of a transfer gate which is linked to the non-selected word line.

A selected word line voltage and a non-selected word line voltage are respectively generated by a selected word line voltage generator 2 and a non-selected word line voltage generator 1, and a selected/non-selected word line selection circuit 3 selects the non-selected word line voltage or the selected word line voltage as a word line voltage. A word line selection address CGA<0:4> decides which word line will be the selected word line.

Furthermore, as the two dummy word lines are always treated as the non-selected word line, a non-selected word line voltage is directly applied to the dummy word lines, not via the selected/non-selected word line selection circuit 3.

In such a configuration, the dummy word lines are always non-selected word lines, and the 32 memory cells put between the dummy word lines can perform an ordinary operation, and yet uniformity of memory cell writing characteristics can be enhanced.

It should be noted that the dummy cells are provided on both bit line and source line sides in FIG. 9, but may be provided on one side. For example, when "1" is written, a pre-charge voltage is given to the bit line and the channel of the cell is charged. The selected/non-selected word line voltage is given to the selected/non-selected word line after the channel of the cell is sufficiently charged, thereby boosting a channel potential. In this case, it is desired that the bit line side selection gate and the source line side selection gate be in the cut-off state, but if the coupling noise subjected to the selection gates at the start of the word line is high, the selection gates will be turned on, and the electric charges will run from the channel to the bit line/source line. Regarding a potential relationship in this instance, generally, the bit line is pre-charged to 2.5 V, and 1.2 V is applied to the bit line side selection gate. On the other hand, the source line is charged to about 1.4 V, and 0 V is applied to the source line side selection gate.

As can be understood from the bias relationship described above, because the bit line side selection gate is more easily turned on than the source line side selection gate, the bit line side has lower coupling noise resistance properties. Therefore, even if the dummy cell is provided only next to the bit line side selection gate, the erroneous writing can be effectively prevented.

Furthermore, the source line is charged to about 1.4 V as described above, but this is done to completely cut off the source line side selection gate, and if the dummy gate is provided on the source line side and it can be cut off even with a source line voltage of 0 V, it is no longer necessary to charge the source line, and current consumption can be reduced. Therefore, a certain degree of effect is obtained if the dummy cell is provided only on the source side.

As described above, a distinctive effect can be achieved even if the dummy cell is provided on either bit line side or source line side. In the first embodiment, a non-selected gate voltage is given to the control gate of this dummy cell. Moreover, a quaternary memory cell is used for the dummy cell in the first embodiment, but a memory cell higher than the quaternary level such as the octal level may be used. Further, the dummy cell does not always need to be a memory cell, and may be a dummy gate in which conduction can be controlled by the control gate.

Second Embodiment

Figure 11:
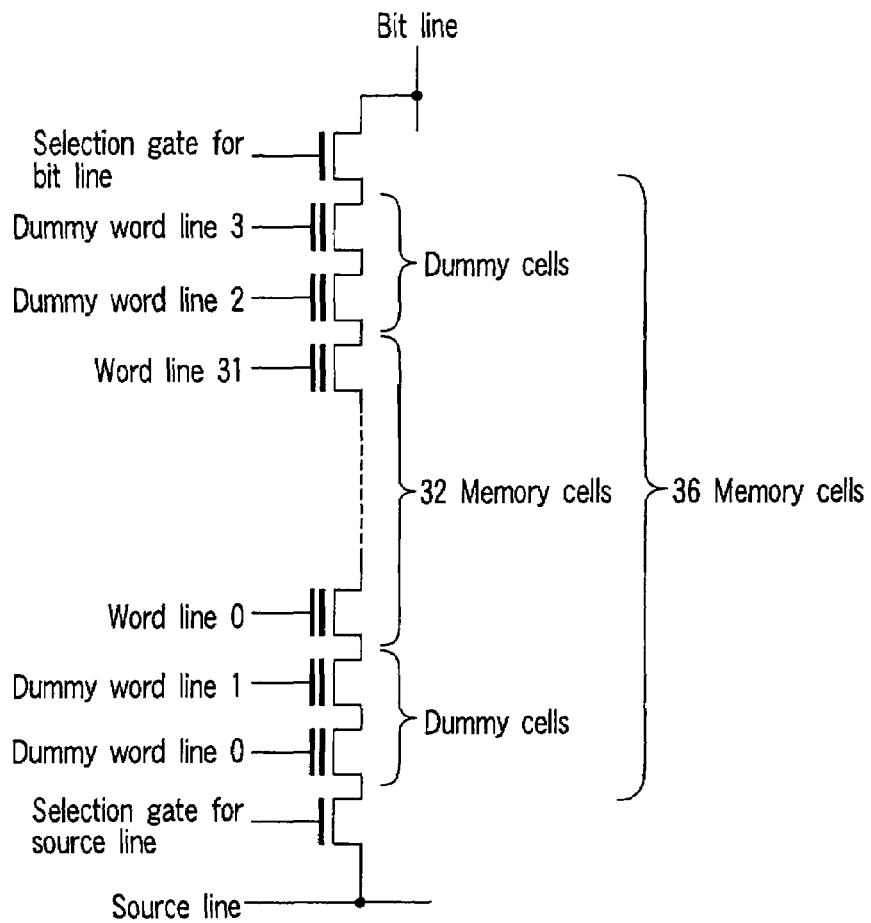
FIG. 11 is a circuit diagram showing the structure of the NAND string in second and third embodiments.

The NAND-structured flash memory in a second embodiment is a quaternary NAND-structured flash memory, and as shown in FIG. 11, one NAND string is composed of the bit line side selection gate (selection transistor), 36 memory cells, and the source line side selection gate. The four memory cells including two next to the bit line side selection gate and two next to the source line side selection gate are treated as dummy cells (dummy gates), and the remaining 32 memory cells are treated as quaternary cells. As the two dummy cells are disposed next to the selection gate, it is possible to have a more uniform bias condition in the operation of writing into the quaternary cells than in the first embodiment.

The circuit in FIG. 10 of the first embodiment can be utilized directly as a word line voltage control circuit. In addition, a quaternary memory cell is also used for the dummy cell in the second embodiment, but a memory cell higher than the quaternary level such as the octal level may be used. Further, the dummy cell does not always need to be a memory cell, and may be a dummy gate in which conduction can be controlled by the control gate. Moreover, a certain degree of effect can be achieved if the dummy cell is provided only on the bit line or source line side. In this case, the non-selected gate voltage is given to the control gate of this dummy cell.

Third Embodiment

The NAND string in a third embodiment has the same configuration as that in the second embodiment, but a control gate charging voltage for the dummy cells adjacent to the selection gates is lower (e.g., 2.5 V) than the ordinary non-selected word line voltage (e.g., 14 V). This makes it possible to keep the effects of the coupling noise lower, which are caused to the selection gate when the control gate is charged.

Figure 12:
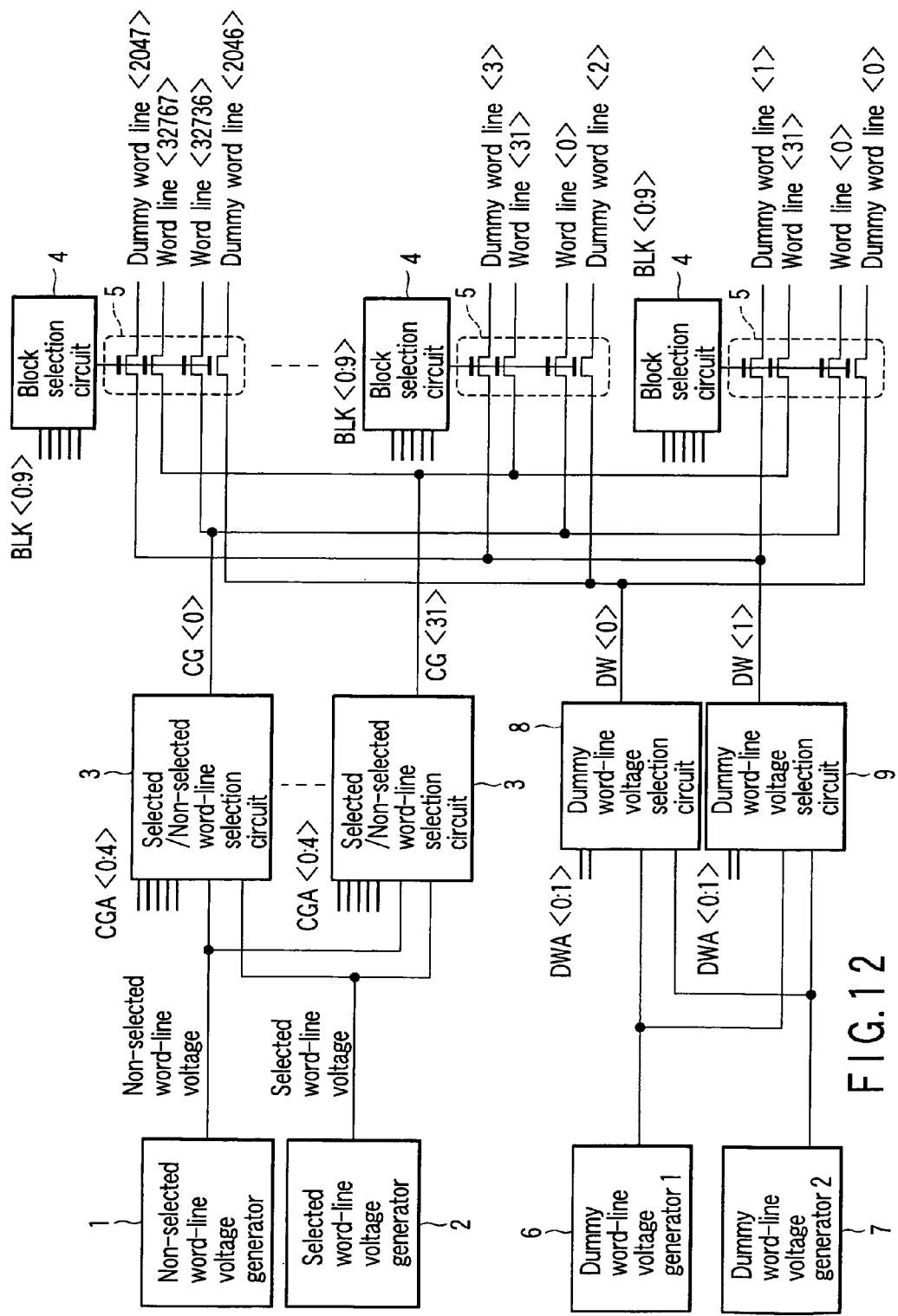
FIG. 12 is a circuit diagram of the word line voltage control circuit in the third embodiment.

FIG. 12 is a circuit diagram of the word line voltage control circuit (word line driving circuit) capable of the operation described above. The difference from the word line voltage control circuit in FIG. 10 is that a first dummy word line voltage generator 6, a second dummy word line voltage generator 7, a first dummy word line voltage selection circuit 8 and a second dummy word line voltage selection circuit 9 are added. As two dummy word line voltage generators are provided, the bit line side dummy gate and the source line side dummy gate can be driven at different voltages.

In addition, a memory cell higher than the quaternary level such as the octal level may be used instead of the quaternary memory cell in the third embodiment, and the dummy cell is not limited to a memory cell and may be a dummy gate in which conduction can be controlled by the control gate. Moreover, a certain degree of effect can be achieved if the dummy cell is provided only on the bit line or source line side.

Fourth Embodiment

Figure 13:
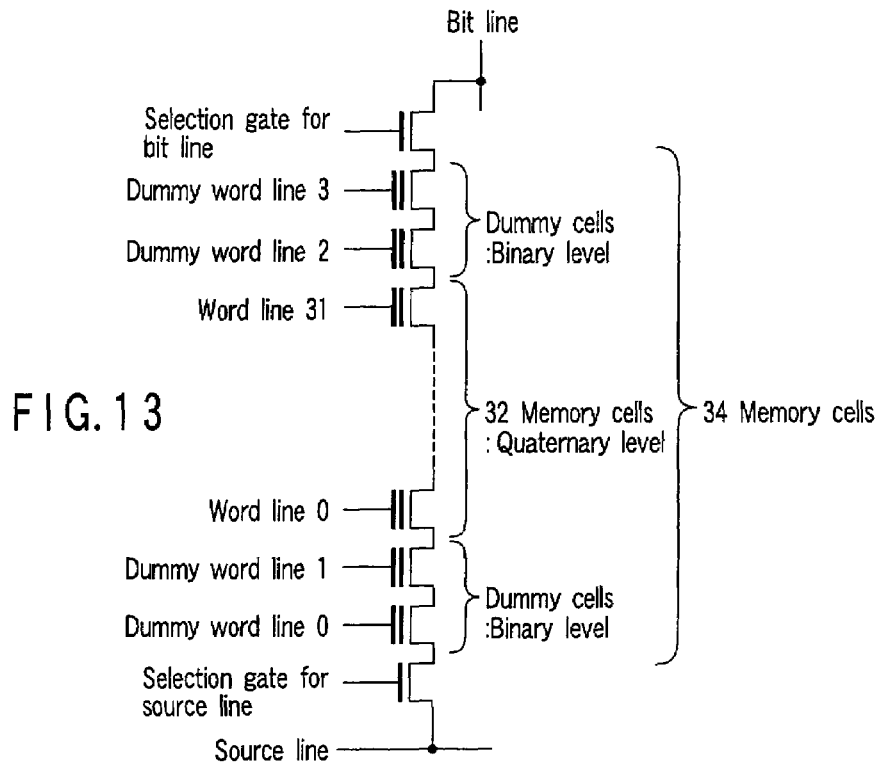
FIG. 13 is a circuit diagram showing the structure of the NAND string in a fourth embodiment.

The NAND-structured flash memory in a fourth embodiment is the quaternary NAND-structured flash memory, and as shown in FIG. 13, one NAND string is composed of the bit line side selection gate (selection transistor), 34 memory cells, and the source line side selection gate. The four memory cells including two next to the bit line side selection gate and two next to the source line side selection gate are treated as binary cells, and the remaining 30 memory cells are treated as quaternary cells. In addition, the 30 memory cells may be memory cells higher than the quaternary level.

Bias uniformity in the operation of writing into the quaternary cell is equal to that in the second embodiment, and the two cells next to the selection gate are treated as binary cells with little concern about the increasing threshold distribution, thereby allowing the degree of integration to be higher than in the second embodiment.

The word line voltage control circuit in the above case can be easily achieved by modifying the circuit shown in FIG. 12. In other words, the first dummy word line voltage generator 6, the second dummy word line voltage generator 7, the first dummy word line voltage selection circuit 8 and the second dummy word line voltage selection circuit 9 may be configured to enable the respective two dummy cells to be driven, and the dummy cells may perform the binary operation.

Fifth Embodiment

The NAND string in a fifth embodiment has the same configuration as that in the first embodiment. The dummy cells are treated as binary cells when data is written or read in a block unit, and when all data is written into the NAND string, its parity is written into the binary cell. The parity is written into the binary cell on either bit line side or source line side, and, for example, a flag that indicates whether the NAND string is in an erased state or written state is written into the other cell. The word line voltage control circuit in that case can be easily achieved by enabling the word line voltage control circuit shown in FIG. 12 to write the parity or flag mentioned above.

Also in the fifth embodiment, the bias uniformity in the operation of writing into the quaternary cell is equal to that in the first embodiment, and the two cells next to the selection gate are treated as binary cells with little concern about the increasing threshold distribution, thereby allowing the degree of integration to be higher than in the first embodiment.

Characteristics common to the first to fifth embodiments described above will be summed up here. Because of the selection gate placed next, the memory cells adjacent to the selection gate are generally different, in the relationship of bias subjected to the memory cells in the writing operation, from the other memory cells placed between the memory cells. Therefore, the memory cell writing characteristics are different in the memory cells next to the selection gate and the memory cells having the memory cells on both sides. Because higher values require strict control of the threshold distribution of the memory cells, a specific writing voltage control considering the writing characteristics is needed for the memory cells next to the selection gate, for example.

The control described above will be a factor of lowered performance and increased complexity of circuits, but according to the first to fifth embodiments, the dummy cells can be provided in the vicinity of the selection gates to achieve simple control of the writing voltage and the uniformity of writing characteristics of the main memory cell. As the wiring width and space of memory circuits are becoming smaller, benefits are provided particularly in the generation of 90 nm or less and multi-level memories.

Furthermore, when the control gate of the memory cell next to the selection gate is charged, the coupling capacitance of the control gate and the selection gate causes the voltage of the selection gate to float in some cases. For example, by providing the dummy gate and properly controlling the control gate voltage of the dummy gate, coupling effects on the selection gate can be minimized.

As described above, the dummy gate can be disposed to have a uniform characteristic of writing into the ordinary memory cells, to enhance its writing performance, and to simplify the control circuit. Moreover, in a multi-level NAND, the dummy gate can be used as the memory cell to record less information than the ordinary memory cell to retain additional information in addition to the effects described above.

Next, an embodiment to reduce pre-charge time will be described as a sixth embodiment.

Sixth Embodiment

Figure 14:
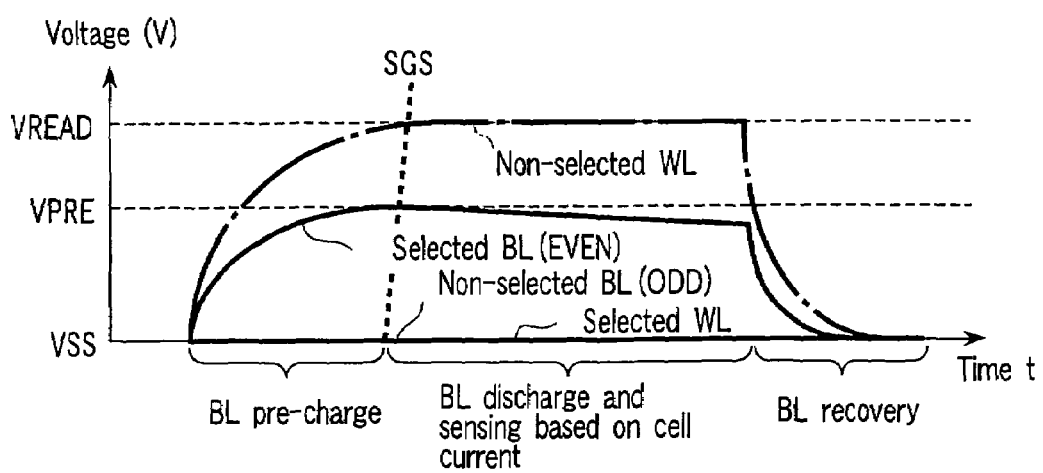
FIG. 14 is a graph explaining a bit line pre-charging method for a conventional NAND-structured flash memory.
Figure 15:
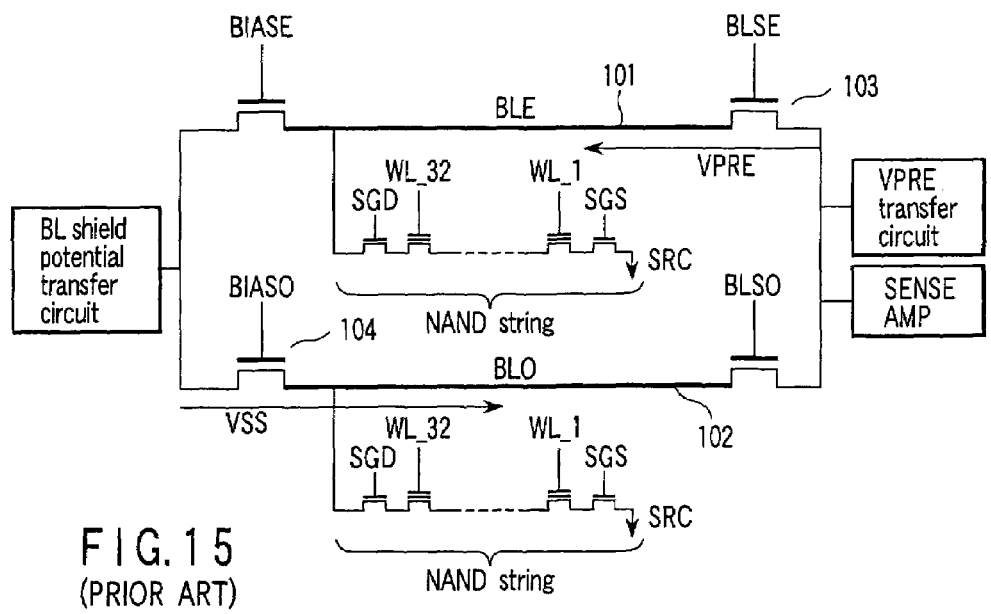
FIG. 15 is a diagram explaining a bit line shielding method for the conventional NAND-structured flash memory.
Figure 16:
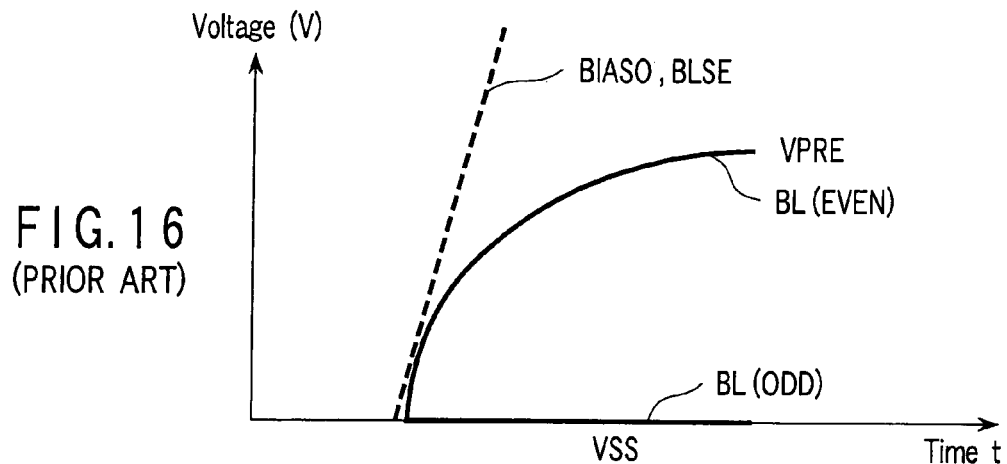
FIG. 16 is a graph showing voltage changes at the start of a bit line selection gate voltage and a bit line pre-charge voltage of the conventional NAND-structured flash memory.

Before describing the sixth embodiment, a reading operation of the NAND-structured flash memory will be more concretely described by use of FIGS. 14 to 16. If a selected bit line 101 is BLE and a non-selected bit line 102 is BLO, the selected bit line BLE is pre-charged to a voltage VPRE from a VPRE transfer circuit because the gate voltage BLSE of a selection gate 103 is H. On the other hand, the non-selected line BLO will be VSS which is a bit line shield potential because the gate voltage BIASO of a selection gate 104 is H.

In the NAND-structured flash memory having the above configuration, the selected bit line 101 is first pre-charged to a pre-charge potential (VPRE) in reading. After the pre-charge, a bit line side selection gate SGD is opened to discharge the electric charges from the cell to the bit line 101 in accordance with a threshold value (signal) written into the cell connected to the selected word line, and its small potential difference is amplified by a sense amplifier. After it is sensed, the bit line 101 recovers its original potential.

On the other hand, the bit lines on both sides of the selected bit line 101 are the non-selected bit lines 102. Noise due to coupling is reduced in such a method that the non-selected bit lines 102 have a fixed potential (e.g., VSS) and are used as shielding lines. More specifically, the selected bit line 101 and the non-selected bit lines 102 are alternately arranged, and they are allocated in different pages. They are temporarily differentiated by parity, and respectively called an EVEN page and an ODD page.

In order to decrease the bit line pre-charge time, the non-selected bit line 102 which is currently at VSS may be pre-charged to the pre-charge potential (VPRE) at the same time. The pre-charge time is reduced because the wiring capacitance between effective adjacent lines is eliminated and the wiring capacitance necessary to drive all the bit lines is reduced.

In this case, however, in the conventional NAND string structure, when the cell linked to the non-selected bit line 102 serving as a shield has a negative threshold value ("1" data), opening the selection gate 104 will cause the current to flow from the bit line 102 to a source line SRC to lower the potential, resulting in the problem that it cannot serve as the shielding line.

Figure 17:
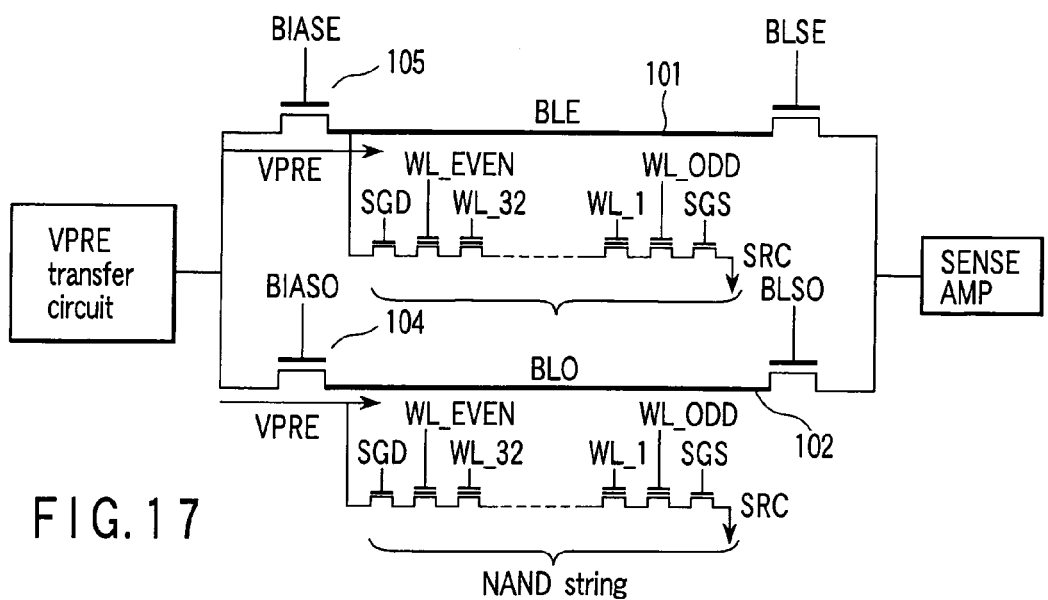
FIG. 17 is a circuit diagram explaining a bit line precharging method in a fifth embodiment.

The sixth embodiment concerns the NAND-structured flash memory capable of solving the above problem. As shown in FIG. 17, in the NAND-structured flash memory according to the sixth embodiment, two new cells are added next to the selection gate to the configuration of a conventional NAND string composed of 32 cells and two selection gates. Information is written into these cells in accordance with the parity of a bit line BL to which the NAND string is linked.

Figure 18:
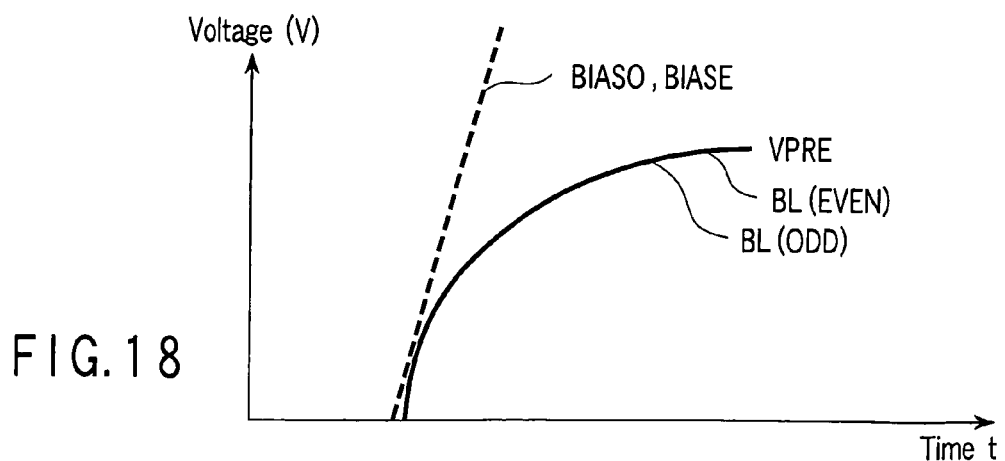
FIG. 18 is a graph showing the voltage changes at the start of the bit line selection gate voltage and the bit line precharge voltage in the fifth embodiment.

FIG. 17 is different from the prior art (FIG. 15) in that a BL shield potential transfer circuit is eliminated, the selected bit line BLE 101 and the non-selected bit line BLO 102 are both charged to the pre-charge voltage by the VPRE transfer circuit via the selection gates 105 and 104 which have been turned on. The voltage changes at this moment in the gate control voltage BIASO, BIASE and the pre-charge potential VPRE are shown in FIG. 18.

Figure 19:
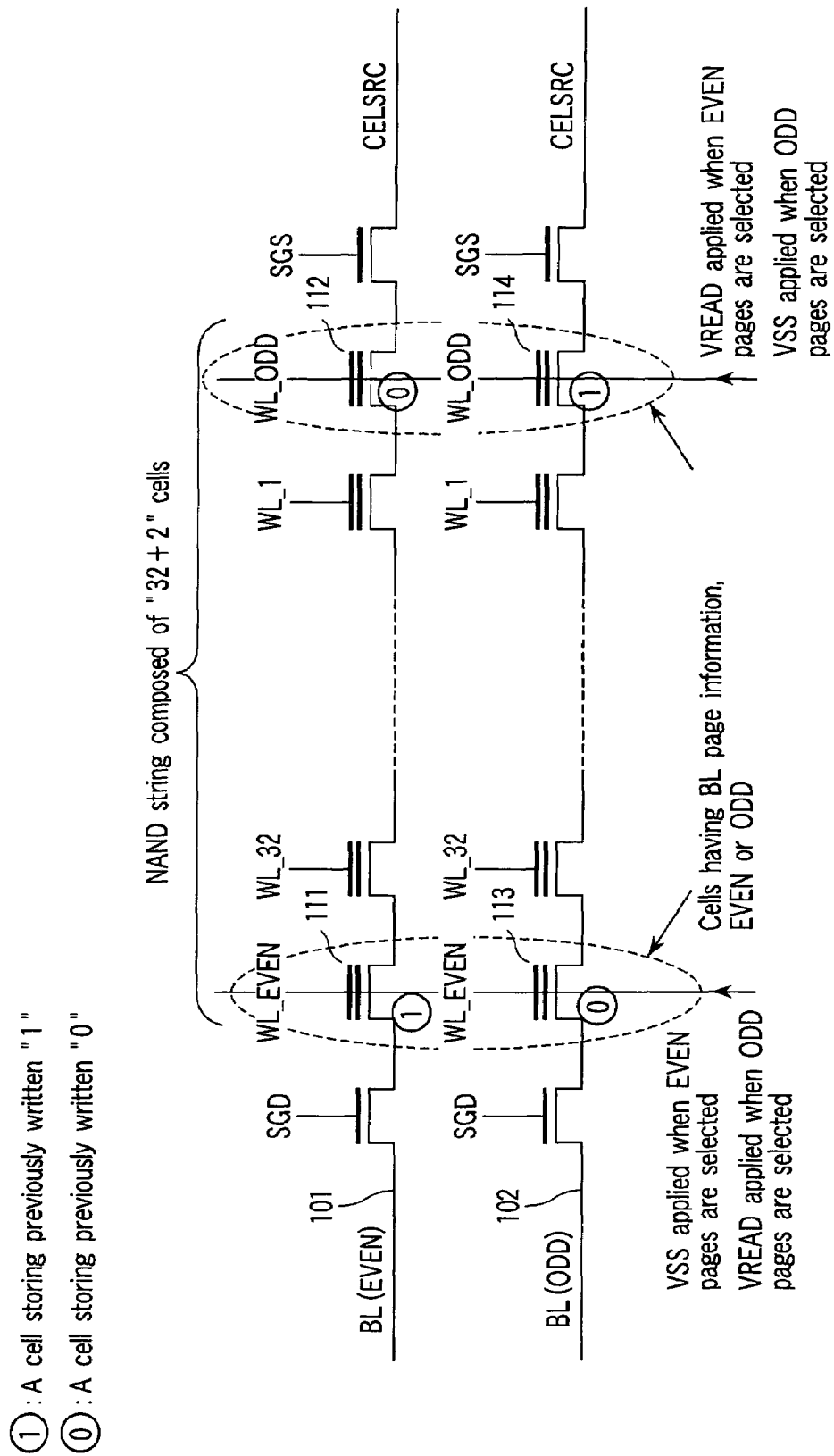
FIG. 19 is a diagram explaining an operation during the pre-charge of bit line in the fifth embodiment.

In an example shown in FIG. 19, a cell 111 next to a drain side selection gate SGE of BL (EVEN) is written as "1", a cell 112 next to a source side selection gate SGE is written as "0", an SGD side cell 113 of BL (ODD) is written as "0", and an SGS side cell 114 is written as "1". In other words, information on whether the bit line to which the cell is linked is an even number sequence or odd number sequence is written into the cells 111, 112, 113 and 114. Moreover, a word line WL_EVEN is connected to the control gates of the SDS side cells 111 and 113, and a word line WL_ODD is connected to the SGS side cells 112 and 114.

In other words, complementary data is written into the two memory cells 111 and 112, or memory cells 113 and 114 within one memory cell. Further, the complementary data is also written into the memory cells 111 and 113, or memory cells 112 and 114 which are connected to the same word line and included in the adjacent bit line.

In the reading operation, WL_EVEN has potential VSS, and WL_ODD has potential VREAD when the EVEN page is read. On the other hand, WL_ODD has potential VSS, and WL_EVEN has potential VREAD when the ODD page is read.

Directing attention to the non-selected ODD side bit line BL 102, for example, when the EVEN page is read under the above configuration and setting of operating condition, WL_EVEN has VSS, and the cell 113 linked thereto is written as "0". Accordingly, the cell 113 is cut off, and the current does not run from the bit line 102 pre-charged to VPRE to a source line CELSRC side.

Similarly, if attention is focused on the non-selected EVEN side BL 101 when the ODD page is read, WL_ODD has VSS, and the cell 112 linked thereto is written as "0". Accordingly, the cell 112 is cut off, and the current does not run from the bit line BL 101 pre-charged to VPRE to the source line CELSRC side.

As described above, in the present embodiment, information on whether the bit line BL to which the NAND string is linked is the EVEN page or ODD page is previously written into the end cell next to the selection gate of the NAND string, so that the cell can be turned on and off by controlling the word line WL.

In this way, even when the non-selected bit line BL serving as the shield is charged to VPRE and the selection gate is opened, the current from the non-selected bit line BL to the source line CELSRC can be cut off, and noise due to the coupling is not caused to the selected bit line BL.

It should be noted that the embodiment has been described above on the presumption that the end cell next to the selection gate is the cell to be cut off, but actually, the cell to be cut off does not have to be the end cell and may be provided in the center of the NAND string. Moreover, the NAND string may have a length of 64 or 128 cells instead of 32 cells, in which case the effect of the added two new cells is small.

Furthermore, in the present invention, information on whether the bit line to which the NAND string is linked is, for example, the EVEN page or ODD page is previously written into the end cell next to the selection gate of the NAND string, so that the cell can be turned on and off by controlling the word line. In this way, even when the non-selected bit line serving as the shield is charged to VPRE and the selection gate is opened, the current cannot run from the bit line to the source line, and noise due to coupling caused to the selected bit line is reduced.

When the bit line is pre-charged in a reading or verifying operation, the selected bit line has conventionally been set to VPRE, and the non-selected bit line to VSS, but in the method described above, the selected bit line and the non-selected bit line are both pre-charged to VPRE at the same time. In other words, since the leakage current that passes when the non-selected bit line is pre-charged to VPRE can be cut off, adjacent coupling capacitance which is the major part of bit line capacitance is eliminated, and the pre-charge time and current consumption can be reduced.

Next, an electronic card will be described as an application of the NAND-structured flash memory of the present invention.

(First Application to Electronic Card)

Figure 20:
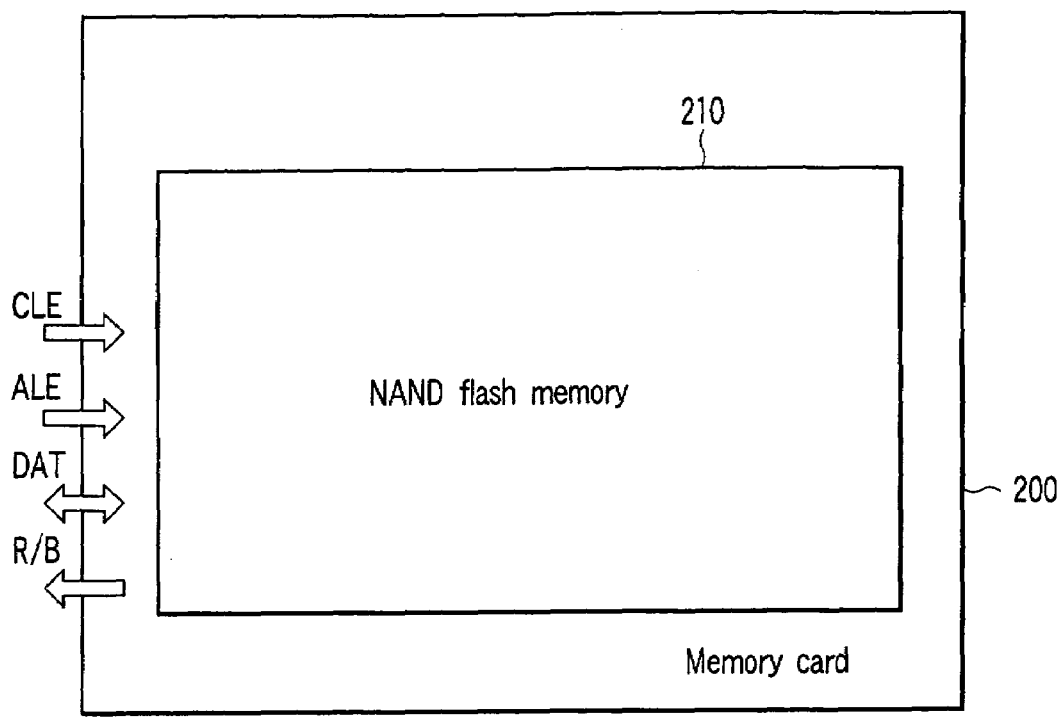
FIG. 20 is a diagram showing a configuration of an electronic card according to a first application of a NAND-structured flash memory of the present invention.

FIG. 20 is a block diagram showing a first application of the NAND-structured flash memory of the present invention to an electronic card.

As shown in FIG. 20, an electronic card, for example, a memory card 100 has a NAND-structured flash memory 110 according to the embodiment of this invention. The NAND-structured flash memory 110 receives a predetermined control signal and data from an unshown external device. Also, it outputs the predetermined control signal and data to the unshown external device. Therefore, connected to the NAND-structured flash memory 110 are a signal line (DAT) which transfers, for example, data, addresses or commands; a command line enable signal line (CLE) which indicates that a command is transferred to the signal line DAT; an address line enable signal line (ALE) which indicates that an address is transferred to the signal line DAT; and a ready/busy signal line (R/B) which indicates whether or not the nonvolatile semiconductor memory device 110 is operable.

In this way, the memory card 100 may be equipped only with the NAND-structured flash memory 110.

(Second Application to Electronic Card)

Figure 21:
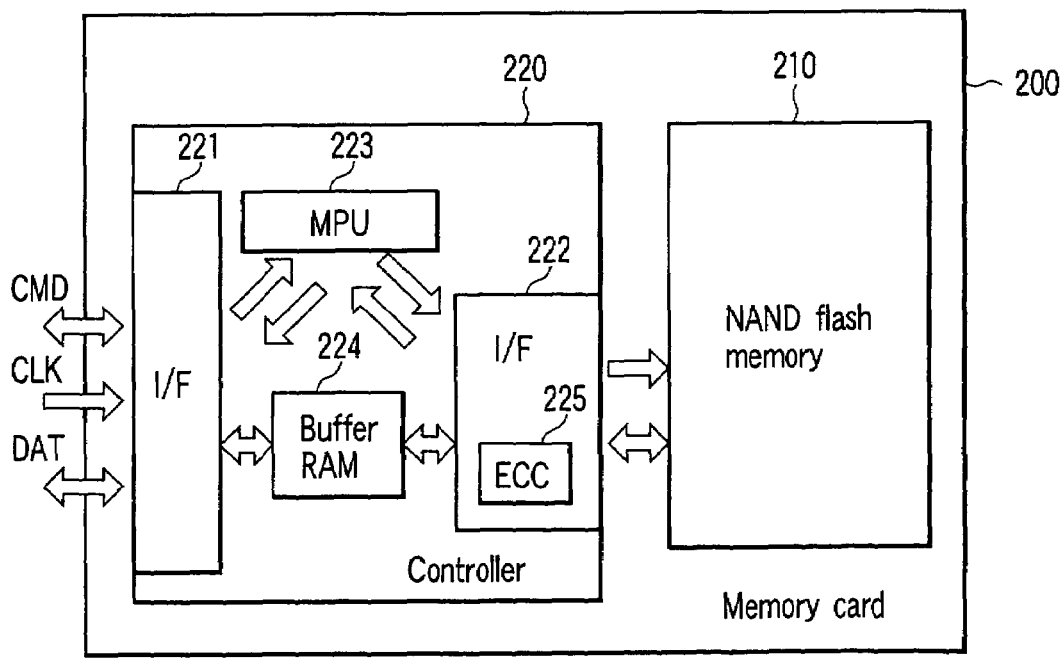
FIG. 21 is a diagram showing the configuration of the electronic card according to a second application of the NAND-structured flash memory of the present invention.

FIG. 21 is a block diagram showing a second application of the NAND-structured flash memory of the present invention to an electronic card.

As shown in FIG. 21, an electronic card, for example, a memory card 200 has a NAND-structured flash memory 210 and a controller 220. The controller 220 controls, for example, the NAND-structured flash memory 210, and exchanges predetermined signals with the unshown external device.

The controller 220 has interface (I/F) sections 221 and 222 which receive the predetermined signals from the NAND-structured flash memory 210 and the unshown external device, or which output the predetermined signal to the external device; a microprocessor (MPU) section 123 which performs predetermined calculations to convert a logical address input from the external device into a physical address; a buffer RAM 224 which temporarily stores data; and an error correction (ECC) section 225 which generates error correcting codes. A command signal line (CMD), a clock signal line (CLK) and a signal line (DAT) are connected to the controller 220.

In this way, the memory card 200 may be equipped with the NAND-structured flash memory 210, and the controller 220 which controls the NAND-structured flash memory 210.

In addition, the controller 220 may be equipped only with the interface section with the external device and the nonvolatile semiconductor memory device 210. In this case, the controller 220 is an integrated circuit device generally called a memory interface.

It should be noted that the controller 220 or the memory interface may be mounted on a different integrated circuit chip from, or the same integrated circuit chip as, that of the NAND-structured flash memory 210.

Figure 22:
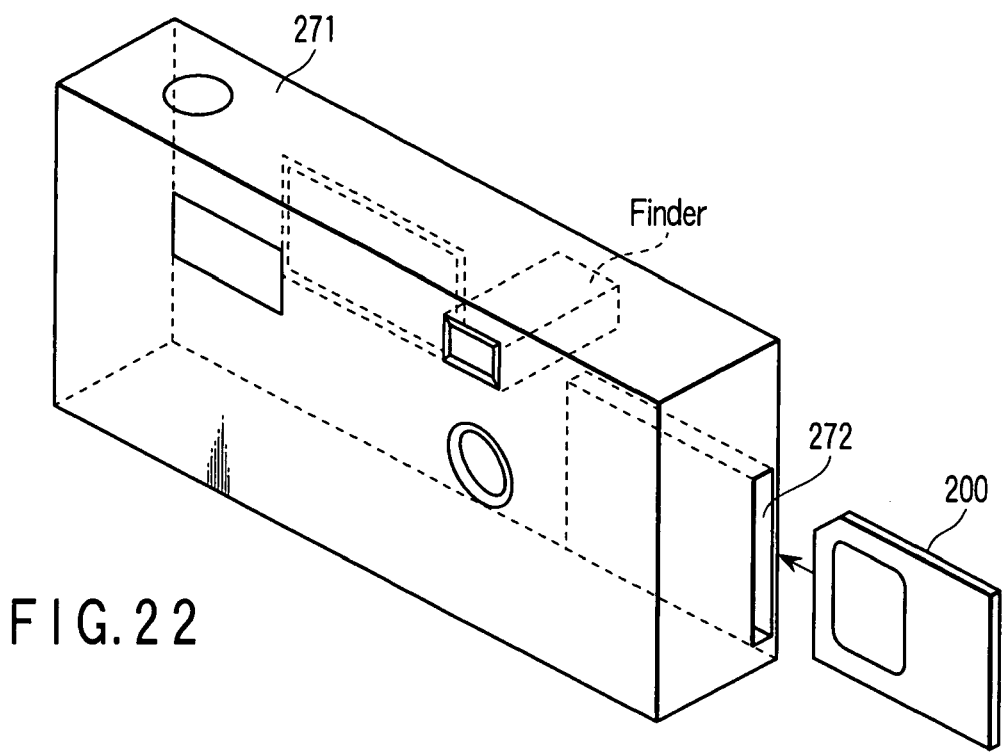
FIG. 22 is a schematic diagram showing an appearance of a digital camera using the electronic card mentioned above.

FIG. 22 is a diagram showing the application of the electronic card to a digital camera, and the electronic card (memory card) 200 is used as a recording medium of the digital camera.

As shown in FIG. 22, a case of a digital camera 271 has a card slot 272 that accommodates a circuit board (not shown) connected thereto. The memory card 200 is detachably installed in the card slot 272 of the digital camera 271. The memory card 200 is installed in the card slot 272 to be electrically connected to an electronic circuit on the circuit board.

Figure 23:
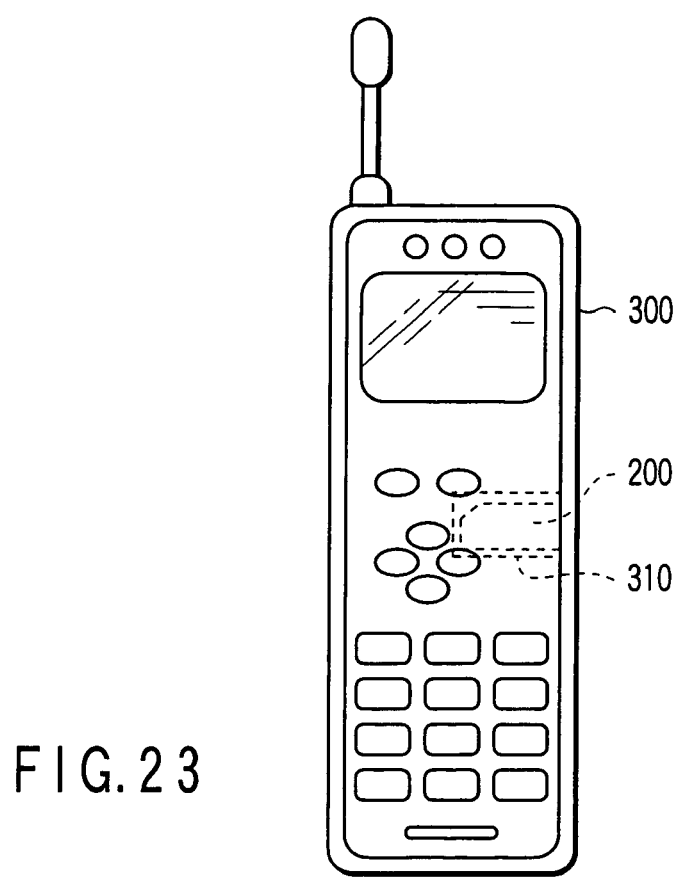
FIG. 23 is a schematic diagram showing an appearance of a mobile telephone using the electronic card mentioned above.

FIG. 23 is a diagram showing the application of the electronic card 200 to a mobile telephone 300, and the electronic card (memory card) 200 is used as an external memory of the mobile telephone 300. The memory card 200 is inserted into an external memory slot 310. The external memory slot is connected to a CPU bus via an interface circuit. The provision of the external memory slot 310 in the mobile telephone 300 enables information stored in the external memory 200 to be read by the mobile telephone 300 and to be input to the mobile telephone 300.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory comprising:
a memory cell array including a plurality of memory strings at least one of the memory cell strings including a plurality of nonvolatile memory cells storable at not less than a quaternary level, the plurality of memory cells having first conducting paths and control gates, respectively, the first conducting paths of the plurality of memory cells being connected in series, a first one of the nonvolatile memory cells in the at least one of the plurality of the memory strings having a function other than an external data storing function;
a first selection transistor having a second conducting path, and one end of the second conducting path being connected to one end of the series of the first conducting paths;
a bit line connected to the other end of the second conducting path of the first selection transistor;
a second selection transistor having a third conducting path, and one end of the third conducting path being connected to the other end of the series of the first conducting paths; and
a source line connected to the other end of the third conducting path of the second selection transistor,
wherein the first one of the nonvolatile memory cells in the at least one of the memory cell strings is adjacent to one of the first selection transistor and the second selection transistor and operates as an n level cell (n is an integer not less than 2), while another of the plurality of nonvolatile memories in the one of the memory cell strings operates as an n+2 or greater level cell.

2. The memory according to claim 1, wherein the at-least first one of the nonvolatile memory cells in the at least one of the memory cell strings is given a non-selected gate voltage.

3. The memory according to claim 1, wherein the first one of the nonvolatile memory cells in the at least one of the memory cell strings includes a first memory cell having a first control gate and adjacent to the bit line or the source line, and a second memory cell, which has a second control gate and is disposed next to the first memory cell away from the bit line or the source line, is supplied with a potential lower than that supplied to the first control gate of the first memory cell.

4. The memory according to claim 1, wherein the nonvolatile memory cells in the at least one of the memory cell strings include two nonvolatile memory cells adjacent to the first selection transistor or the second selection transistor; the two nonvolatile memory cells operate as binary cells; and the rest of the plurality of nonvolatile memory cells are quaternary cells.

5. A NAND-structured flash memory comprising:
a memory cell array including a plurality of memory strings, at least one of the memory cell strings including a plurality of nonvolatile memory cells storable not less than quaternary level, the plurality of memory cells having first conducting paths and control gates, respectively, the first conducting paths of the plurality of memory cells being connected in series, one of the nonvolatile memory cells in the at least one of the plurality of memory strings having a function other than an external data storing function;
a first selection transistor having a second conducting path, and one end of the second conducting path being connected to one end of the series of the first conducting paths;
a first bit line connected to the other end of the second conducting path of the first selection transistor;
a second bit line adjacent to the first bit line and connected to another of the memory cell strings;
a second selection transistor having a third conducting path, and one end of the third conducting path being connected to one end of the series of the first conducting paths;
a word line crossing a first bit line and the second bit line, and
a source line connected to the other end of the third conducting path of the second selection transistor,
wherein in the one of the nonvolatile memory cells in the at least one of the memory cell strings, information on whether first bit line linked to the one of the nonvolatile memory cells is an even number column or odd number column is written, and
complementary data is written into a pair of the nonvolatile memory cells which are connected to the word line and are linked to the first bit line and the second bit line, and the complementary data is written in another pair of the nonvolatile memory cells included in the at least one of the plurality of memory strings.

6. A NAND-structured flash memory comprising:
a memory cell array in which a plurality of memory strings, each having a plurality of serially connected memory cells, are arranged;
a first selection transistor having a first conducting path, one end of the first conducting path being connected to an end of one of the plurality of memory strings;
a second selection transistor having a second conduction path, one end of the second conducting path being connected to the other end of the one of the plurality of memory strings;
a first bit connected to the other end of the first conducting path of the first selection transistor;
a second bit line adjacent to the first bit line and connected to another of the memory cell strings;
a word lines crossing the first bit line and the second bit line,
wherein in one memory cell in one of the memory strings, information on whether the first bit line linked to the one memory cell is an even number column or an odd number column is written, and complementary data is written in two memory cells which are connected to the word line and are included in the first bit line and the second bit line.

7. The NAND-structured flash memory according to claim 6, wherein two memory cells in the one of the memory strings are used to retain the information on whether the first bit line is the even number column or the odd number column.

8. The NAND-structured flash memory according to claim 7, wherein the two memory cells retaining the information on whether the first bit line is the even number column or the odd number column are adjacent to the first selection transistor and the second selection transistor, respectively.

9. The NAND-structured flash memory according to claim 7, wherein the two memory cells retaining the information on whether the bit line is the even number column or the odd number column have complementary data which is written therein.

10. The memory according to claim 1, wherein a second one of the nonvolatile memory cells in the at least one of the plurality of memory strings, which is adjacent to the other of the first selection transistor and the second selection transistor, has the function other than the external data storing function.

11. The memory according to claim 1, wherein n in the n level cell is identical to one number selected from the group consisting of 2, 4, 8 and 16.

* * * * *